(12) United States Patent
Imai

(10) Patent No.: US 9,337,437 B2
(45) Date of Patent: May 10, 2016

(54) PHOTOELECTRIC CONVERSION ELEMENT AND IMAGING DEVICE

(71) Applicant: FUJIFILM Corporation, Tokyo (JP)

(72) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 47 days.

(21) Appl. No.: 14/263,259

(22) Filed: Apr. 28, 2014

(65) Prior Publication Data

US 2014/0231781 A1    Aug. 21, 2014

Related U.S. Application Data

(63) Continuation of application No. PCT/JP2012/078041, filed on Oct. 30, 2012.

(30) Foreign Application Priority Data

Oct. 31, 2011  (JP) .................. 2011-238923

(51) Int. Cl.
*H01L 27/14*  (2006.01)
*H01L 51/44*  (2006.01)
*H01L 27/146*  (2006.01)

(52) U.S. Cl.
CPC ......... *H01L 51/448* (2013.01); *H01L 27/14665* (2013.01); *Y02E 10/549* (2013.01)

(58) Field of Classification Search
CPC ... H01L 31/075; H01L 31/076; H01L 31/101; H01L 31/0263; H01L 31/0368; H01L 31/03685; H01L 31/0463; H01L 31/035272
USPC ............................................ 257/53, E31.102
See application file for complete search history.

(56) References Cited

U.S. PATENT DOCUMENTS

| | | | |
|---|---|---|---|
| 4,527,007 A * | 7/1985 | Fuse | 136/256 |
| 2006/0196533 A1 | 9/2006 | Maehara | |
| 2007/0215204 A1 | 9/2007 | Maehara | |
| 2008/0123009 A1 * | 5/2008 | Son et al. | 349/46 |

(Continued)

FOREIGN PATENT DOCUMENTS

| | | |
|---|---|---|
| JP | 2005-203321 A | 7/2005 |
| JP | 2006-245045 A | 9/2006 |

(Continued)

OTHER PUBLICATIONS

An Office Action; "Notification of Reasons for Refusal," issued by the Japanese Patent Office on Feb. 24, 2015, which corresponds to Japanese Patent Application No. 2012-239339 and is related to U.S. Appl. No. 14/263,259; with English laguage translation.

(Continued)

*Primary Examiner* — Michael Lebentritt
(74) *Attorney, Agent, or Firm* — Studebaker & Brackett PC

(57) ABSTRACT

A photoelectric conversion element is formed by laminating, in order, a substrate, a lower electrode, an organic layer which generates electric charge by light irradiation, an upper electrode which transmits light, a buffer layer and a protective film. The buffer layer is formed from hydrogenated silicon oxide containing hydrogen ions, and has a thickness of 1 to 100 nm. The protective film contains hydrogenated silicon nitride containing hydrogen ions or hydrogenated silicon oxynitride containing hydrogen ions and has a thickness of 30 to 500 nm.

15 Claims, 4 Drawing Sheets

(56) References Cited

U.S. PATENT DOCUMENTS

| | | | |
|---|---|---|---|
| 2010/0187516 A1 | 7/2010 | Yoshizawa et al. | |
| 2011/0232732 A1* | 9/2011 | Myong | 136/255 |
| 2012/0037905 A1* | 2/2012 | Murai et al. | 257/53 |
| 2012/0234375 A1* | 9/2012 | Nakamura et al. | 136/249 |
| 2013/0025656 A1* | 1/2013 | Yang et al. | 136/255 |
| 2013/0061915 A1* | 3/2013 | Myong et al. | 136/255 |

FOREIGN PATENT DOCUMENTS

| | | |
|---|---|---|
| JP | 2007-250890 A | 9/2007 |
| JP | 2010-244697 A | 10/2010 |
| JP | 2011-198856 A | 10/2011 |
| WO | 2009/004690 A1 | 1/2009 |

OTHER PUBLICATIONS

Notification of Transmittal of Copies of Translation of the International Preliminary Report on Patentability and Translation of Written Opinion of the International Searching Authority; PCT/JP2012/078041 issued on May 15, 2014.

International Search Report; PCT/JP2012/078041; Dec. 11, 2012.

An Office Action issued by the Korean Patent Office on Jan. 18, 2016, which corresponds to Korean Patent Application No. 10-2014-7011555 and is related to U.S. Appl. No. 14/263,259; with English language partial translation.

* cited by examiner

FIG.1
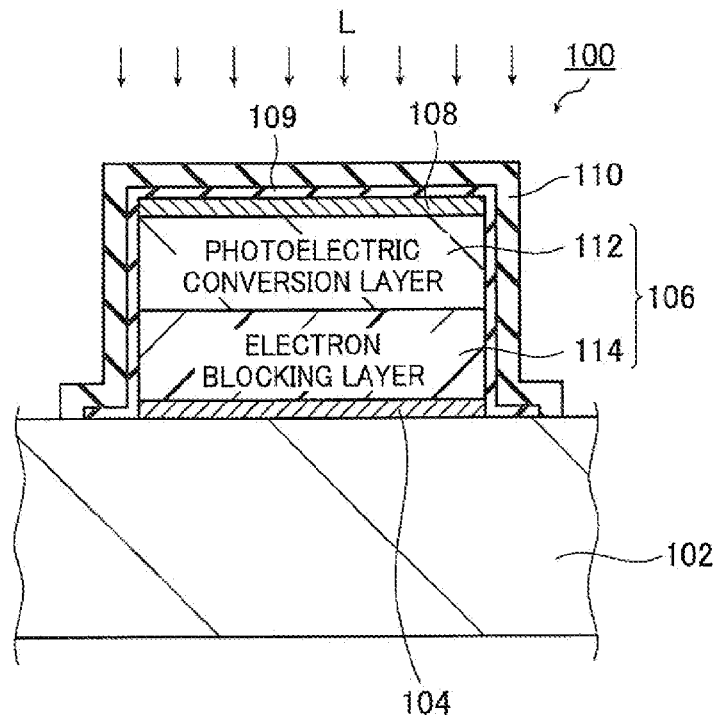
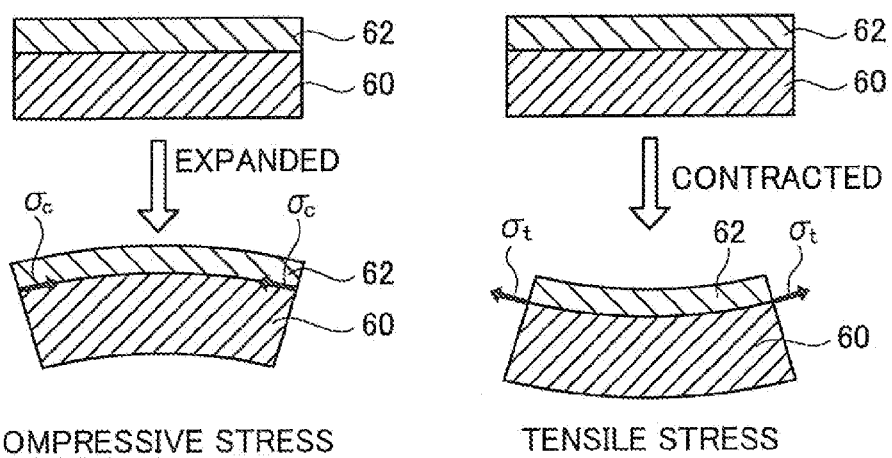
COMPRESSIVE STRESS       TENSILE STRESS
FIG.2A                   FIG.2B

PHOTOELECTRIC CONVERSION ELEMENT AND IMAGING DEVICE

CROSS REFERENCE TO RELATED APPLICATIONS

This application is a continuation application of International Application PCT/JP2012/078041 filed on Oct. 30, 2012, which claims priority under 35 U.S.C. 119(a) to Application No. 2011-238923 filed in Japan on Oct. 31, 2011, all of which are hereby expressly incorporated by reference into the present application.

BACKGROUND OF THE INVENTION

The present invention relates to a photoelectric conversion element and an imaging device each having a photoelectric conversion layer composed of an organic layer configured to generate electric charges according to received light, i.e., an organic photoelectric conversion layer and each converting an optical image including at least a visible light image into an electric signal, and particularly to a photoelectric conversion element and an imaging device that are excellent in barrier properties and heat resistance.

As image sensors used for digital still cameras, digital video cameras, cameras for cellular phones, cameras for endoscopes, and the like, solid-state imaging devices (so-called CCD sensors or CMOS sensors) in which pixels having photodiodes are arrayed on a semiconductor substrate such as a silicon (Si) chip and signal electric charges corresponding to photoelectrons generated by the photodiodes of the individual pixels are obtained by a CCD-type or CMOS-type readout circuit, are widely known.

In recent years, an imaging device formed of an organic material and having an organic photoelectric conversion layer configured to generate electric charges according to received light is being studied.

The solid-state imaging device having the organic photoelectric conversion layer (hereinafter also simply called "imaging device") is made up of a pixel electrode (lower electrode) formed on a semiconductor substrate on which a signal readout circuit is formed; the organic photoelectric conversion layer formed on the pixel electrode; a transparent counter electrode (upper electrode) formed on the organic photoelectric conversion layer; a protective film formed on the counter electrode for protecting the counter electrode; a color filter; and the like.

In the imaging device, when bias voltage is applied between the pixel electrode and the counter electrode, an exciton generated in the organic photoelectric conversion layer is dissociated into an electron and a hole, and a signal corresponding to the electric charge of the electron or hole that has moved to the pixel electrode according to the bias voltage is obtained by a CCD-type or CMOS-type readout circuit.

It is known that, in an imaging device having an organic photoelectric conversion layer, a protective film is formed on the organic photoelectric conversion layer by low temperature plasma-enhanced CVD at a temperature in the range from room temperature to about 80° C. (JP 2006-245045 A).

JP 2006-245045 A discloses a photoelectric conversion film-stacked type solid-state imaging device using an organic semiconductor and having a protective layer composed of an inorganic material which is formed above a transparent counter electrode. The inorganic material constituting the protective layer comprises silicon oxide, silicon nitride or silicon oxynitride, and the protective layer is formed by plasma-enhanced CVD capable of film formation at low temperatures (normal temperatures).

It is also known that, in an imaging device having an organic photoelectric conversion layer, a buffer layer is provided between a transparent upper electrode and a protective film in order to mitigate the influence of stress from the protective film (JP 2007-250890 A).

JP 2007-250890 A discloses a photoelectric conversion device including a first electrode formed on a flat plane of a substrate; a photoelectric conversion layer formed in an upper side of the first electrode; and a second electrode formed in an upper side of the photoelectric conversion layer, the photoelectric conversion device further including a deterioration factor adsorptive and/or reactive layer which is a layer for covering the first electrode, the photoelectric conversion layer and the second electrode and which has at least one of adsorptivity of adsorbing a deterioration factor and reactivity of reacting with the deterioration factor; and a protective layer covering the deterioration factor adsorptive and/or reactive layer so as to protect the first electrode, the photoelectric conversion layer and the second electrode.

As the deterioration factor adsorptive and/or reactive layer, a layer of a metal complex $Alq_3$ (tris(8-hydroxyquinolinato)aluminum(III) complex) formed by resistance heating vapor deposition is disclosed. It is described that, when a layer composed of silicon nitride and obtained by plasma-enhanced CVD (layer thickness: 1 μm) is used as the protective layer, the change in dark current in the case where the deterioration factor adsorptive and/or reactive layer composed of $Alq_3$ is formed is smaller compared to the case where the same is not formed.

SUMMARY OF THE INVENTION

In relation to the formation of the protective film, shortening the film formation time, lowering the internal stress and simplifying the equipment for film formation are required. Accordingly, it is desirable to form the buffer layer and the protective film not by a vacuum evaporation method as employed in JP 2007-250890 A but only by a plasma-enhanced CVD method.

A protective nitride film containing nitrogen (N), e.g., a SiNx film has high barrier properties. When a hydrogenated silicon nitride (SiNx:H) film is formed as the protective film by a plasma-enhanced CVD method, $NH_3$ gas is used as a process gas. In this case, since the counter electrode (upper electrode) has a small thickness of about 5 nm to about 30 nm, the organic layer is exposed to $NH_3$ gas as well as radicals and ions generated from the $NH_3$ gas. The inventor found that, when the organic layer is exposed to $NH_3$ gas as well as radicals and ions generated from the $NH_3$ gas, heat resistance of a photoelectric conversion element deteriorates. Thus, the protective film achieving both barrier properties and heat resistance cannot be formed by using a plasma-enhanced CVD method as it stands, so that barrier properties and heat resistance of the solid-state imaging device are not necessarily sufficient.

An object of the present invention is to solve the foregoing problems of the foregoing prior art and to provide a photoelectric conversion element and an imaging device that are excellent in barrier properties and heat resistance.

In order to achieve the foregoing object, the present invention provides a photoelectric conversion element comprising: a substrate; a lower electrode formed on the substrate; an organic layer formed on the lower electrode and adapted to generate electric charges in response to irradiation with light; an upper electrode formed on the organic layer and adapted to transmit the light; a buffer layer formed on the upper electrode; and a protective film formed on the buffer layer, wherein the buffer layer is composed of hydrogenated silicon oxide (SiOx:H) containing hydrogen ions and has a thickness of 1 nm to 100 nm; and wherein the protective film is composed of hydrogenated silicon nitride (SiNy:H) containing hydrogen ions or hydrogenated silicon oxynitride (SiOxNy:H) containing hydrogen ions and has a thickness of 30 nm to 500 nm.

Preferably, the buffer layer contains no element nitrogen. Containing no element nitrogen (N) herein means that the element nitrogen content is zero. However, also in the case where nitrogen is contained in such an amount that it can be considered as an impurity, the element nitrogen is still regarded as not contained. For instance, when $N_2O$ gas is used as a film formation process gas in formation of the hydrogenated silicon oxide film (SiOx:H), the element nitrogen (N) resulted by decomposition of $N_2O$ is to be contained as an impurity in the hydrogenated silicon oxide film but in this case, the element nitrogen (N) is regarded as not contained. The hydrogenated silicon oxide film containing such impurities has a refractive index at 550 nm of 1.50 or less, preferably 1.48 or less, and even more preferably 1.47 or less.

Preferably, the protective film has an internal stress of 100 MPa or less as expressed in absolute value. Furthermore, the buffer layer and the protective film are preferably formed by a vapor phase film formation method.

Preferably, the upper electrode has a thickness of 5 nm to 30 nm. Preferably, the hydrogenated silicon oxynitride is expressed by a formula: SiOxNy:H, where x≥0 and y>0.6, more preferably x>0.5 and y>0.6. The content of hydrogen H contained as hydrogen ions is preferably 10 atm % to 40 atm %.

Preferably, the light includes at least visible light; the organic layer generates electric charges in response to irradiation of the light including at least visible light; and the upper electrode is formed of a conductive material showing transparency with respect to the light including at least visible light.

Preferably, the organic layer includes a photoelectric conversion layer that is formed on a side closer to the upper electrode and that is adapted to generate electric charges according to an amount of received light, and an electron blocking layer that is formed at a side closer to the lower electrode and that is adapted to inhibit electrons from being injected into the photoelectric conversion layer from the lower electrode. The photoelectric conversion layer preferably has a thickness of 10 nm to 1000 nm, and the electron blocking layer preferably has a thickness of 20 nm to 300 nm.

Furthermore, the present invention provides an imaging device comprising the above-described photoelectric conversion element.

According to the present invention, a photoelectric conversion element and an imaging device that are excellent in barrier properties and heat resistance can be obtained. It should be noted that the invention may be applied also to an organic electroluminescence film element (organic EL element) and an organic solar cell.

BRIEF DESCRIPTION OF THE DRAWINGS

FIG. 1 is a schematic cross-sectional view showing a photoelectric conversion element of an embodiment of the present invention.

FIGS. 2A and 2B are schematic cross-sectional views each illustrating stress acting on a thin film formed on a substrate.

DETAILED DESCRIPTION OF THE INVENTION

Figure 3:
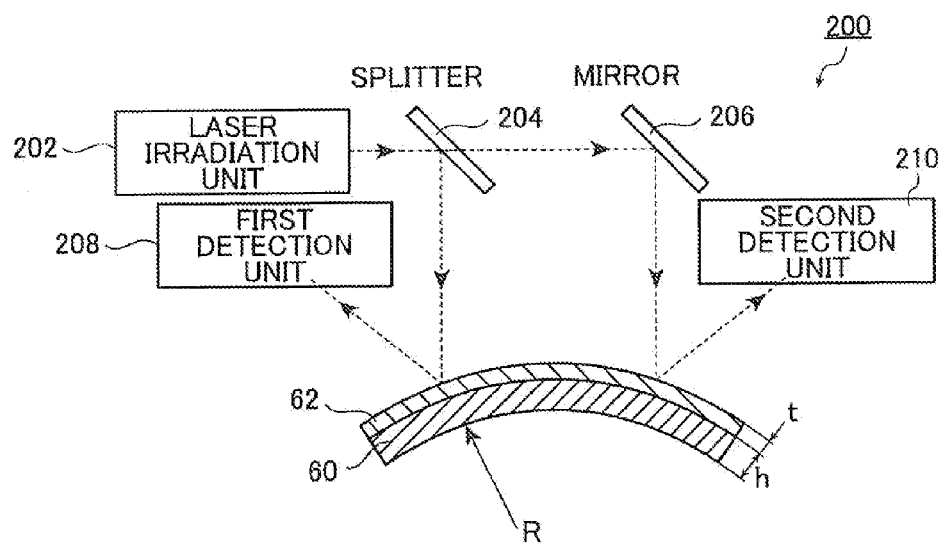
FIG. 3 is a schematic view showing an apparatus for measuring a degree of warpage of a substrate on which a thin film has been formed.

Hereinafter, based on a preferred embodiment shown in the attached drawings, a photoelectric conversion element and an imaging device of the present invention will be described in detail.

FIG. 1 is a schematic cross-sectional view showing a photoelectric conversion element of an embodiment of the present invention.

A photoelectric conversion element 100 shown in FIG. 1 is configured to change incident light L to an electric signal. In the photoelectric conversion element 100, a lower electrode 104 is formed on a substrate 102, and an organic layer 106 is formed on the lower electrode 104. An upper electrode 108 is formed on the organic layer 106. The organic layer 106 is disposed between the lower electrode 104 and the upper electrode 108. The organic layer 106 has a photoelectric conversion layer 112 containing an organic substance and an electron blocking layer 114, and the electron blocking layer 114 is formed on the lower electrode 104.

A buffer layer 109 covering the top of the upper electrode 108 and also covering all of end faces of the upper electrode 108, the organic layer 106 and the lower electrode 104 is provided on the substrate 102. A protective film 110 entirely covering the buffer layer 109 is provided on the substrate 102.

The substrate 102 is constituted with, for example, a silicon substrate or a glass substrate.

The lower electrode 104 is an electrode for collecting holes from electric charges generated by the organic layer 106. Any material may be used for the lower electrode 104 as long as it has conductivity, and examples thereof include metals; metal oxides, metal nitrides, metal borides, and the like which have conductivity; organic conductive compounds; mixtures of these; and the like. Specific examples thereof include conductive metal oxides such as tin oxide, zinc oxide, indium oxide, indium tin oxide (ITO), indium zinc oxide (IZO), indium tungsten oxide (IWO), and titanium oxide; conductive metal nitrides such as titanium nitride (TiN), molybdenum nitride, tantalum nitride, and tungsten nitride; metals such as gold (Au), platinum (Pt), silver (Ag), chromium (Cr), nickel (Ni), and aluminum (Al); mixtures or laminates consisting of these metals and conductive metal oxides; organic conductive compounds such as polyaniline, polythiophene, and polypyrrole; laminates consisting of these organic conductive compounds and ITO; and the like. As a material of the lower electrode 104, any of titanium nitride, molybdenum nitride, tantalum nitride, and tungsten nitride is particularly preferable.

The organic layer 106 is a layer which receives light and generates electric charges according to the amount of the light. The organic layer 106 includes the photoelectric conversion layer 112 which is so constituted as to contain a photoelectric conversion material. As the photoelectric conversion material, organic compounds can be used. For example, the photoelectric conversion layer 112 is preferably a layer containing a p-type organic semiconductor material or an n-type organic semiconductor material. The photoelectric conversion layer 112 is more preferably a bulk-hetero layer as a mixture of an organic p-type compound and an organic n-type compound. The photoelectric conversion layer is even more preferably a bulk-hetero layer as a mixture of an organic p-type compound and a fullerene or a fullerene derivative. When the bulk-hetero layer is used as the photoelectric conversion layer 112, it is possible to improve photoelectric conversion efficiency by making up for a defect such as a short carrier diffusion length in the organic layer. When the bulk-hetero layer is prepared at an optimal mixing ratio, electron mobility and hole mobility in the photoelectric conversion layer 112 can be improved, whereby an optical response speed of the photoelectric conversion element can be sufficiently increased. A proportion of a fullerene or a fullerene derivative in the bulk-hetero layer is preferably 40% to 85% (volume ratio). The bulk-hetero layer (bulk-hetero junction structure) is described in detail in JP 2005-303266 A.

The thickness of the photoelectric conversion layer 112 is preferably from 10 nm to 1,000 nm, more preferably from 50 nm to 800 nm, and particularly preferably from 100 nm to 500 nm. When the thickness of the photoelectric conversion layer 112 is 10 nm or more, a preferable effect of suppressing dark currents is obtained, and when the thickness of the photoelectric conversion layer 112 is 1,000 nm or less, preferable photoelectric conversion efficiency is obtained.

It is preferable for the layer, which constitutes the photoelectric conversion layer 112 and contains the aforementioned organic compounds, to be formed by a vacuum evaporation method. It is preferable for all steps at the time of evaporation to be performed in a vacuum. Basically, the compounds are prevented from coming into direct contact with oxygen or moisture in the outside air. A method of controlling the deposition rate by means of PI or PID control using a film thickness monitor such as a quarts oscillator or an interferometer is preferably used. When two or more kinds of compounds are simultaneously deposited, a coevaporation method, a flash evaporation method, and the like can be preferably used.

The electron blocking layer 114 is a layer for inhibiting electrons from being injected into the organic layer 106, particularly the photoelectric conversion layer 112 from the lower electrode 104. The electron blocking layer 114 contains either or both of an organic material and an inorganic material.

The electron blocking layer 114 is a layer for preventing electrons from being injected into the organic layer 106 (photoelectric conversion layer 112) from the lower electrode 104, and is constituted with a single layer or plural layers. The electron blocking layer 114 may be constituted with a film formed of a single organic material or with a film formed of a mixture of plural different kinds of organic materials. It is preferable for the electron blocking layer 114 to be constituted with a material which forms a high electron injection barrier against electrons from the adjacent lower electrode 104 and has a high degree of hole transport properties. It is preferable that as the electron injection barrier, electron affinity of the electron blocking layer 114 be smaller than the work function of the adjacent electrode by 1 eV or more, more preferably by 1.3 eV or more, and particularly preferably by 1.5 eV or more.

It is preferable for the electron blocking layer 114 to have a thickness of 20 nm or more, more preferably 40 nm or more, and particularly preferably 60 nm or more, so as to sufficiently inhibit the contact between the lower electrode 104 and the photoelectric conversion layer 112 and to avoid the influence exerted by defectiveness or dust present on the surface of the lower electrode 104.

If the electron blocking layer 114 is too thick, this leads to a problem in which voltage that needs to be supplied for applying an appropriate field intensity to the photoelectric conversion layer 112 increases, and a problem in which a process of transporting carriers in the electron blocking layer 114 negatively affects the performance of the photoelectric conversion element. Accordingly, the total thickness of the electron blocking layer 114 is preferably 300 nm or less, more preferably 200 nm or less, and even more preferably 100 nm or less.

The upper electrode 108 is an electrode for collecting electrons from electric charges generated by the organic layer 106. In order to cause light to enter the organic layer 106, the upper electrode 108 is configured to be sufficiently transparent with respect to the light at a wavelength to which the organic layer 106 has sensitivity, e.g., visible light. By applying bias voltage between the upper electrode 108 and the lower electrode 104, of electric charges generated by the organic layer 106, holes can be moved to the lower electrode 104, and electrons can be moved to the upper electrode 108.

For the upper electrode 108, in order to increase an absolute amount of light entering the photoelectric conversion layer 112 and to increase external quantum efficiency, transparent conductive oxides are used.

As a material of the upper electrode 108, any of ITO, IZO, tin oxide ($SnO_2$), antimony-doped tin oxide (ATO), zinc oxide (ZnO), Al-doped zinc oxide (AZO), gallium-doped zinc oxide (GZO), titanium oxide ($TiO_2$), and fluorine-doped tin oxide (FTO) is preferable.

The optical transmittance of the upper electrode 108 is preferably 60% or higher, more preferably 80% or higher, even more preferably 90% or higher, and still more preferably 95% or higher, in a visible wavelength range.

Moreover, it is preferable for the upper electrode 108 to have a thickness of 5 nm to 30 nm. When the upper electrode 108 has a film thickness of 5 nm or more, the electrode can sufficiently cover the under layer, and uniform performance is obtained. On the other hand, when the upper electrode 108 has a film thickness in excess of 30 nm, a short circuit is locally caused between the upper electrode 108 and the lower electrode 104, whereby a level of dark currents increases in some cases. By setting the film thickness of the upper electrode 108 to 30 nm or less, it is possible to prevent the occurrence of local short circuit.

The buffer layer 109 is a layer for improving heat resistance of the photoelectric conversion element 100. Specifically, the buffer layer 109 serves to inhibit the deterioration of heat resistance of the organic layer 106. The buffer layer 109 is formed on the substrate 102 so as to entirely cover the laminate consisting of the lower electrode 104, the organic layer 106 and the upper electrode 108.

A silicon compound film containing the element nitrogen (nitrogen: N) has high barrier properties and is therefore suitably used for the protective film 110. When a hydrogenated silicon nitride ($SiN_x:H$) film or a hydrogenated silicon oxynitride ($SiO_xN_y:H$) film is formed as the protective film 110 on the upper electrode 108 by a plasma-enhanced CVD method, $NH_3$ gas is used as a process gas.

In this case, since the upper electrode 108 has a small thickness of about 5 nm to about 30 nm, the organic layer 106 is exposed to $NH_3$ gas as well as radicals and ions generated from the $NH_3$ gas. The inventor found that, when the organic layer 106 is exposed to $NH_3$ gas as well as radicals and ions generated from the NH₃ gas, heat resistance of photoelectric conversion characteristics of the organic layer 106 deteriorates.

On the basis of this finding, a layer composed of hydrogenated silicon oxide (SiOx:H) containing hydrogen ions but no element nitrogen (N) is provided under the protective film 110, whereby the exposure of the organic layer 106 to NH₃ gas can be prevented during laminating (forming) the protective film 110. The layer composed of hydrogenated silicon oxide (SiOx:H) containing hydrogen ions but no element nitrogen (N) is used as the buffer layer 109. Accordingly, even when NH₃ gas is used at the time of the formation of the protective film 110, owing to the buffer layer 109, it is possible to avoid the contact of the organic layer 106 with the NH₃ gas and inhibit the deterioration of heat resistance of the organic layer 106.

Containing no element nitrogen (N) herein means that the element nitrogen content is substantially zero. However, also in the case where nitrogen (N) is contained in such an amount that it can be considered as an impurity, the element nitrogen (N) is still regarded as not contained. Even when the element nitrogen (N) is contained as impurities, this is not a problem as long as the refractive index at 550 nm is 1.50 or less, preferably 1.48 or less, and even more preferably 1.47 or less.

The buffer layer 109 has a thickness of 1 nm to 100 nm. When the buffer layer 109 has a thickness of less than 1 nm, the buffer layer 109 cannot prevent the influence exerted by NH₃ gas and by radicals and ions generated from the NH₃ gas. On the other hand, when the buffer layer 109 has a thickness exceeding 100 nm, the combined film thickness of the buffer layer 109 and the protective film 110 becomes large, and accordingly, color mixture easily occurs.

The buffer layer 109 is formed by, for instance, a vapor deposition method. The vapor deposition method is for example a plasma-enhanced CVD method.

When a hydrogenated silicon oxide film (SiOx:H film) is formed as the buffer layer 109 by a plasma-enhanced CVD method, this hydrogenated silicon oxide film is to contain hydrogen ions (see JP 2011-129935 A for example). Accordingly, as the buffer layer 109, the hydrogenated silicon oxide (SiOx:H) film containing hydrogen ions is used. It should be noted that the buffer layer 109 is also transparent with respect to incident light L (e.g., visible light).

In hydrogenated silicon oxide (SiOx:H) used for the buffer layer 109 in the present invention, a value of x preferably satisfies $1.3<x<2.2$, and a hydrogen ion content is preferably from 10 atm % to 40 atm %.

It is preferable for a value of x and the hydrogen ion content to respectively fall within the foregoing ranges because, when they fall within the foregoing ranges, heat resistance can be ensured with the transparency of the film being maintained, and the influence exerted by NH₃ gas and by radicals and ions generated from the NH₃ gas can be more efficiently prevented during the formation of the protective film 110.

The protective film 110 is provided for preventing factors such as water and oxygen which deteriorate an organic material from intruding into the organic layer 106 containing the organic material, and prevents the organic layer 106 from deteriorating after long term storage and long term use. The protective film 110 is formed on the substrate 102 so as to entirely cover the buffer layer 109.

The protective film 110 is composed of hydrogenated silicon oxynitride (SiOxNy:H) containing hydrogen ions or hydrogenated silicon nitride (SiNy:H) containing hydrogen ions and has a film thickness of 30 to 500 nm and more preferably of 70 to 500 nm.

In the SiOxNy:H film used as the protective film 110, values of x and y satisfy preferably $0 \leq x$ and $0.5<y$, more preferably $0 \leq x<1.5$ and $0.5<y<1.3$, and even more preferably $0.5<x<1.5$ and $0.5<y<1.3$, respectively. The hydrogen ion content is preferably from 10 atm % to 40 atm %.

In the case of x=0, as described above, hydrogenated silicon nitride (SiNy:H) is used for the protective film 110. However, the term of hydrogenated silicon oxynitride (SiOxNy:H) is used here also in the case of x=0.

It is preferable for values of x and y and the hydrogen ion content to respectively fall within the foregoing ranges because, when they satisfy the foregoing ranges, the protective film can have excellent barrier properties.

When the protective film 110 has a thickness of less than 30 nm, the protection against an acid, an alkali, and the like during the immersion therein is difficult. On the other hand, when the protective film 110 has a thickness exceeding 500 nm, color mixture easily occurs.

As the protective film 110, element nitrogen (N)-rich hydrogenated silicon oxynitride film (SiOxNy:H film) containing hydrogen ions is preferable for use. In the element nitrogen-rich SiOxNy:H film containing hydrogen ions, values of x and y satisfy preferably $0.5<x$ and $0.6<y$, and more preferably $0.5<x<1.5$ and $0.6<y<1.3$, respectively. The hydrogen ion content is preferably from 10 atm % to 40 atm %.

This element nitrogen-rich hydrogenated silicon oxynitride (SiOxNy:H) film containing hydrogen ions has more excellent barrier properties and serves to prevent heat resistance of the organic layer 106 from deteriorating.

The protective film 110 is formed by, for instance, a vapor deposition method. The vapor deposition method is for example a plasma-enhanced CVD method. When the protective film 110 is formed by a vapor deposition method, this can make the internal stress small. The internal stress of the protective film 110 is preferably 100 MPa or less in absolute value. Specifically, the protective film 110 preferably has, as its internal stress, a tensile stress of 100 MPa or less and a compressive stress of 100 MPa or less.

The protective film 110 is also transparent with respect to incident light L (e.g., visible light).

The internal stress of the protective film 110 is within the range from 100 MPa to −100 MPa, whereby even when a chemical solution penetrates the protective film 110 from its defective portion in the step of forming the color filters, the delamination of the protective film 110 can be avoided.

In the photoelectric conversion element 100 constituted as above, the upper electrode 108 functions as an electrode of a light incidence side. After entering from the upper side of the upper electrode 108, the light is transmitted through the upper electrode 108 and enters the photoelectric conversion layer 112 of the inorganic layer 106, and electric charges are generated in the photoelectric conversion layer 112. Of the generated electric charges, holes move to the lower electrode 104. The holes having moved to the lower electrode 104 are converted into voltage signals according to their amounts and read out. In this manner, light can be converted into voltage signals and read out.

In this embodiment, the buffer layer 109 composed of hydrogenated silicon oxide (SiOx:H) containing hydrogen ions but no element nitrogen (N) is disposed between the protective film 110 and the upper electrode 108, and the hydrogenated silicon oxynitride film or hydrogenated silicon nitride film (SiOxNy:H film; $0 \leq x$, $0.6<y$) containing hydrogen ions, more preferably element nitrogen (N)-rich hydrogenated silicon oxynitride film (SiOxNy:H film; $0.5<x$, $0.6<y$) containing hydrogen (H) ions is provided as the protective film 110. Owing to this configuration, the buffer layer 109 serves to ensure heat resistance whilst the protective film 110 serves to ensure barrier properties. As a result, the photoelectric conversion element 100 excellent in both barrier properties and heat resistance can be obtained.

Next, the method for producing the photoelectric conversion element 100 will be described.

First, a TiN electrode, for instance, is formed on the substrate 102 as the lower electrode 104 so as to prepare a TiN substrate.

In the TiN substrate, for example, TiN as a lower electrode material is formed into a film on the substrate 102 by a sputtering method in a vacuum of a predetermined degree, whereby a TiN electrode is formed as the lower electrode 104.

Thereafter, on the lower electrode 104, an electron blocking material, for example, a carbazole derivative, more preferably a bifluorene derivative, is formed into a film by means of, for example, a vacuum deposition method in a vacuum of a predetermined degree, whereby the electron blocking layer 114 constituting the organic layer 106 is formed.

Subsequently, onto the electron blocking layer 114, as a photoelectric conversion material, for example, a p-type organic semiconductor material and a fullerene or a fullerene derivative are co-deposited in a vacuum of a predetermined degree, whereby the photoelectric conversion layer 112 constituting the organic layer 106 is formed.

Thereafter, on the photoelectric conversion layer 112, a transparent conductive oxide, for example, ITO is formed into a film by a sputtering method. In this manner, for example, the upper electrode 108 constituted with ITO is formed on the photoelectric conversion layer 112.

Next, the hydrogenated silicon oxide film (SiOx:H film) is formed to a thickness of 1 to 100 nm by, for example, a low temperature plasma-enhanced CVD method so as to cover the lower electrode 104, the organic layer 106 and the upper electrode 108. The low temperature plasma-enhanced CVD method is used for the film formation, and $SiH_4$ gas and $N_2O$ gas are used as process gases. $N_2$ gas may be used as carrier gas. Thus, the hydrogenated silicon oxide (SiOx:H) film containing hydrogen ions is used as the buffer layer 109, in which the element nitrogen is contained at a level of impurities.

The film formation temperature of the buffer layer 109 is preferably 125° C. to 250° C. and more preferably 125° C. to 200° C.

This is because, when the film formation temperature is within the above range, the SiOx:H film having low permeability with respect to $NH_3$ gas as well as radicals and ions can be formed, the photoelectric conversion element having excellent heat resistance can be obtained, and the deterioration of the organic photoelectric conversion film, which may be caused by the temperature at the time of forming the SiOx:H film, can be avoided.

Subsequently, the protective film 110 is formed on the buffer layer 109.

As the protective film 110, the hydrogenated silicon oxynitride film or the hydrogenated silicon nitride film (SiOxNy:H film) is formed to a thickness of 30 to 500 nm by, for example, a low temperature plasma-enhanced CVD method. The low temperature plasma-enhanced CVD method is used for the film formation, and $SiH_4$ gas, $NH_3$ gas, $N_2O$ gas and the like are used as process gases. The disposed buffer layer 109 inhibits the contact between the organic layer 106 and $NH_3$ gas as well as radicals and ions generated from the $NH_3$ gas. Accordingly, adverse effects caused during the formation of the protective film 110 and the deterioration of heat resistance of the organic layer 106 can be suppressed.

The film formation temperature of the protective film 110 is preferably 150° C. to 250° C. and more preferably 150° C. to 230° C.

This is because, when the film formation temperature is within the above range, the change in the composition of the protective film hardly occurs even in the high-temperature and high-humidity environment, and hence the photoelectric conversion element having excellent barrier properties can be obtained. In addition, the deterioration of the organic photoelectric conversion film, which may be caused by the temperature at the time of forming the protective film, can be avoided.

As described above, the internal stress of the protective film 110 is preferably 100 MPa or less in absolute value. Therefore, it is preferable to obtain in advance film formation conditions required for adjusting the internal stress to 100 MPa or less in absolute value and then to form the protective film 110 to a thickness of 30 to 500 nm under the obtained film formation conditions.

In the producing method of this embodiment, even when $NH_3$ gas is used as a process gas at the time of the formation of the hydrogenated silicon oxynitride film (SiOxNy:H film) containing hydrogen ions as the protective film 110, the buffer layer 109 serves to inhibit the deterioration of heat resistance of the organic layer 106. As a result, the photoelectric conversion element 100 excellent in both barrier properties and heat resistance can be obtained.

Furthermore, both of the buffer layer 109 and the protective film 110 are formed by a plasma-enhanced CVD method and therefore can be formed in a same film formation chamber by using different process gases. Accordingly, the buffer layer 109 and the protective film 110 can be formed with a single film formation device, and this leads to simplification of the production facility. As a result, the production costs can be reduced.

The deposition rate with the use of plasma-enhanced CVD method is higher as compared to other film formation methods such as a vapor deposition method, and therefore the productivity can be enhanced. Furthermore, since the protective film 110 is formed by a low temperature plasma-enhanced CVD method at 250° C. or less, a low internal stress of, for instance, 100 MPa or less in absolute value can be achieved.

Hereinafter the internal stress of the protective film 110 and the measurement method thereof will be described.

In order to describe the stress acting on a thin film 62, a substrate 60 on which the thin film 62 is formed as shown in FIGS. 2A and 2B will be used as an example. The thin film 62 corresponds to the protective film 110.

In FIG. 2A, the directions of a compressive stress $\sigma_c$ acting on the thin film 62 when the substrate 60 on which the thin film 62 is formed is expanded, are indicated by arrows. When the substrate 60 is bent such that the side where the thin film 62 is formed projects as in FIG. 2A, the thin film 62 formed on the substrate 60 is expanded, and a compressive force acts on the thin film 62 adhering to the substrate 60. This force is the compressive stress $\sigma_c$.

In FIG. 2B, the directions of a tensile stress $\sigma_t$ acting on the thin film 62 when the substrate 60 on which the thin film 62 is formed is contracted, are indicated by arrows. When the substrate 60 is bent such that the side where the thin film 62 is formed becomes concave as in FIG. 2B, the thin film 62 formed on the substrate 60 contracts, and a tensile force acts on the thin film 62 adhering to the substrate 60. This force is the tensile stress $\sigma_t$.

The compressive stress $\sigma_c$ and the tensile stress $\sigma_t$ of the thin film 62 influence a degree of warpage of the substrate 60.

Based on a degree of warpage of the substrate 60, the stresses can be measured using an optical lever method.

FIG. 3 is a schematic view showing an apparatus for measuring a degree of warpage of the substrate on which the thin film is formed. A measurement apparatus 200 shown in FIG. 3 has a laser irradiation unit 202 that emits laser light, a splitter 204 that reflects a portion of light emitted from the laser irradiation unit 202 and transmits the other portion thereof, and a mirror 206 that reflects the light transmitted through the splitter 204. The thin film 62 to be measured is formed on one surface of the substrate 60. The thin film 62 on the substrate 60 is irradiated with the light reflected by the splitter 204, and at this time, a reflection angle of the light that reflects on the surface of the thin film 62 is detected by a first detection unit 208. The thin film 62 on the substrate 60 is irradiated with the light reflected by the mirror 206, and at this time, a reflection angle of the light that reflects on the surface of the thin film 62 is detected by a second detection unit 210.

FIG. 3 shows an example in which the compressive stress acting on the thin film 62 is measured by bending the substrate 60 such that the surface of the side where the thin film 62 is formed projects. Herein, the thickness of the substrate 60 is indicated by h, and the thickness of the thin film 62 is indicated by t.

Next, the measurement procedure of the stress of the thin film by using the measurement apparatus 200 will be described.

As the apparatus used for the measurement, for example, a thin film stress measuring apparatus FLX-2320-S manufactured by Toho Technology Corporation can be used. The measurement conditions set when this apparatus is used are shown below.

(Laser Light (Laser Irradiation Unit 202))

Used laser: KLA-Tencor-2320-S

Laser output power: 4 mW

Laser wavelength: 670 nm

Scanning speed: 30 mm/s (Substrate)

Substrate material: silicon (Si)

Crystal orientation: <100>

Type: p-type (dopant: boron)

Thickness: 250±25 μm or 280±25 μm (Measurement Procedure)

A degree of warpage of the substrate 60 on which the thin film 62 will be formed is measured in advance to obtain a radius of curvature R1 of the substrate 60. Thereafter, the thin film 62 is formed on one surface of the substrate 60, and a degree of warpage of the substrate 60 is measured to obtain a radius of curvature R2. Herein, the surface of the substrate 60 on the side where the thin film 62 is formed is scanned by the laser as shown in FIG. 3, and the degree of warpage is calculated from the reflection angle of the laser light reflected by the substrate 60. Based on the obtained degree of warpage, the radius of curvature R is calculated by the following equation.

$$\text{Radius of curvature } R = R1 \cdot R2/(R1-R2)$$

Subsequently, by the following equation, the stress of the thin film 62 is calculated. The stress of the thin film 62 is expressed in the unit Pa. The compressive stress is determined as a negative value, and a tensile stress is determined as a positive value. The method for measuring the stress of the thin film 62 is not particularly limited, and known methods can be used.

(Equation for Calculating Stress)

$$\sigma = E \times h^2/6(1-\nu)Rt$$

$E/(1-\nu)$: biaxial elastic modulus (Pa) of the base substrate $\sigma$: Poisson ratio h: thickness (m) of the base substrate t: film thickness (m) of the thin film R: radius of curvature (m) of the base substrate $\sigma$: average stress (Pa) of the thin film Next, an imaging device using the photoelectric conversion element 100 will be described.

Figure 4:
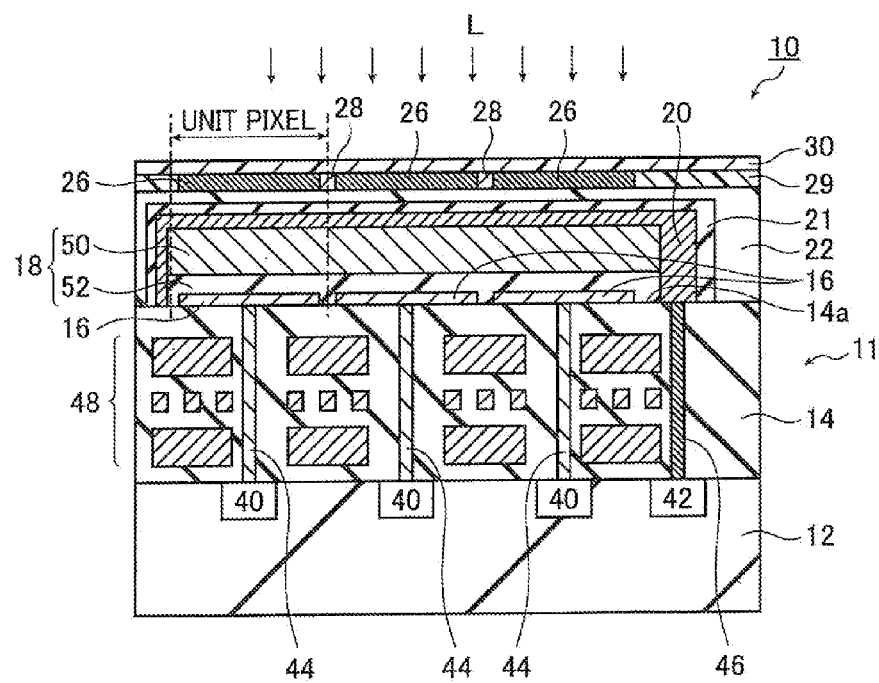
FIG. 4 is a schematic cross-sectional view showing an imaging device according to an embodiment of the present invention.

FIG. 4 is a schematic cross-sectional view showing an imaging device according to an embodiment of the present invention.

The imaging device according to the embodiment of the present invention can be used for imaging apparatuses such as digital cameras and digital video cameras. The imaging device can also be mounted on imaging modules and the like of electronic endoscopes, cellular phones, and the like.

An imaging device 10 shown in FIG. 4 is a device for converting an optical image, e.g., a visible light image into an electric signal, and has a substrate 12, an insulating layer 14, pixel electrodes (lower electrodes) 16, an organic layer 18, a counter electrode (upper electrode) 20, a buffer layer 21, a protective film (sealing layer) 22, color filters 26, partitions 28, a light shielding layer 29, and an overcoat layer 30.

In the substrate 12, readout circuits 40 and a counter electrode voltage supply unit 42 are formed.

The pixel electrode (lower electrode) 16, the organic layer 18, the counter electrode (upper electrode) 20, the buffer layer 21 and the protective film 22 of the imaging device 10 in this embodiment constitute the photoelectric conversion element of the invention, and respectively correspond to the lower electrode 104, the organic layer 106, the upper electrode 108, the buffer layer 109 and the protective film 110 of the photoelectric conversion element 100 described in the foregoing. Accordingly, the detailed description on the corresponding portions will not be given.

As the substrate 12, for example, a glass substrate or a semiconductor substrate such as Si is used. On the substrate 12, the insulating layer 14 formed of a known insulating material is formed. On a surface of the insulating layer 14, plural pixel electrodes 16 are formed. The pixel electrodes 16 are arrayed in a one-dimensional or two-dimensional manner.

In the insulating layer 14, first connection portions 44 which connect the pixel electrodes 16 and the readout circuits 40 are formed, and a second connection portion 46 which connects the counter electrode 20 and the counter electrode voltage supply unit 42 is formed. The second connection portion 46 is formed in a position where the portion 46 is not connected to the pixel electrodes 16 or the organic layer 18. The first connection portion 44 and the second connection portion 46 are formed of a conductive material.

In the inside of the insulating layer 14, a wiring layer 48 which is formed of a conductive material and is for connecting the readout circuit 40 and the counter electrode voltage supply unit 42 to, for example, the outside of the imaging device 10 is formed.

As described above, the pixel electrodes 16 connected to the respective first connection portions 44 are formed on the surface 14a of the insulating layer 14 on the substrate 12, and this structure is called a circuit board 11. The circuit board 11 is also called a CMOS board.

The organic layer 18 is formed so as to cover the plural pixel electrodes 16 and to avoid the second connection portion 46. The organic layer 18 has a photoelectric conversion layer 50 and an electron blocking layer 52. The photoelectric conversion layer 50 and the electron blocking layer 52 correspond to the photoelectric conversion layer 112 and the electron blocking layer 114, respectively, of the organic layer 106 of the photoelectric conversion element 100 described above.

In the organic layer 18, the electron blocking layer 52 is formed on the side of the pixel electrodes 16, and the photoelectric conversion layer 50 is formed on the electron blocking layer 52.

The electron blocking layer 52 is a layer for inhibiting electrons from being injected into the photoelectric conversion layer 50 from the pixel electrodes 16.

The photoelectric conversion layer 50 generates electric charges according to the amount of received light such as incident light L (e.g., visible light) and contains an organic photoelectric conversion material. The film thicknesses of the photoelectric conversion layer 50 and the electron blocking layer 52 are required to be constant only above the pixel electrodes 16. The details of the photoelectric conversion layer 50 and the electron blocking layer 52 will be described later.

The counter electrode 20 is an electrode opposed to the pixel electrodes 16 and covers the photoelectric conversion layer 50. The photoelectric conversion layer 50 is disposed between the pixel electrodes 16 and the counter electrode 20.

The counter electrode 20 is constituted with a conductive material showing transparency with respect to incident light L (e.g., visible light) so as to cause light to enter the photoelectric conversion layer 50. The counter electrode 20 is electrically connected to the second connection portion 46 positioned outside the photoelectric conversion layer 50 and hence electrically connected to the counter electrode voltage supply unit 42 via the second connection portion 46.

For the counter electrode 20, the same material as that of the upper electrode 108 can be used. Accordingly, the details of the material, optical transmittance and film thickness of the counter electrode 20 will not be described.

The counter electrode voltage supply unit 42 applies predetermined voltage to the counter electrode 20 through the second connection portion 46. When the voltage which should be applied to the counter electrode 20 is higher than the power supply voltage of the imaging device 10, the counter electrode voltage supply unit 42 increases the power supply voltage by using a booster circuit such as a charge pump and supplies the aforementioned predetermined voltage.

The pixel electrodes 16 are electric charge-collecting electrodes for collecting electric charges generated by the photoelectric conversion layer 50 disposed between the pixel electrodes 16 and the counter electrode 20 opposed to the pixel electrodes 16. The pixel electrodes 16 are connected to the readout circuits 40 through the first connection portions 44. The readout circuits 40 are disposed in the substrate 12 so as to respectively correspond to the plural pixel electrodes 16. The readout circuits 40 read out signals corresponding to the electric charges collected by the pixel electrodes 16 which correspond thereto.

For the pixel electrodes 16, the same material as that of the lower electrode 104 can be used. Accordingly, the detail of the material of the pixel electrodes 16 will not be described.

When a level difference corresponding to the film thickness of the pixel electrode 16 is steep at the edge of the pixel electrodes 16, when the surface of the pixel electrode 16 has marked concavities or convexities, or when fine dust (particles) adheres onto the pixel electrodes 16, the thickness of the photoelectric conversion layer 50 or the electron blocking layer 52 over the pixel electrodes 16 becomes smaller than a desired size or cracks occur in the layer. If the counter electrode 20 is formed on the layers in such a state, due to the contact between the pixel electrodes 16 and the counter electrode 20 and concentration of electric field in the defective portion, pixel defectiveness such as increase of dark currents, a short circuit, or the like is caused. Moreover, the defectiveness described above may deteriorate adhesion between the pixel electrodes 16 and the layer over the electrodes or deteriorate heat resistance of the imaging device 10.

In order to prevent the above defectiveness and improve reliability of the device, it is preferable to control a surface roughness Ra of the pixel electrodes 16 to be 0.6 nm or less. When the surface roughness Ra of the pixel electrodes 16 is smaller, this means that the concavities and convexities of the surface are smaller accordingly, and hence the surface flatness is more excellent. In order to remove particles on the pixel electrodes 16, it is particularly preferable to wash the pixel electrodes 16 and the like by using a general washing technique, which is used in a semiconductor production process, before the electron blocking layer 52 is formed.

The readout circuit 40 is constituted with, for example, a CCD, CMOS or TFT circuit, and shielded from light by a light shielding layer (not shown in the drawing) disposed inside the insulating layer 14. For a common use as an image sensor, the readout circuits 40 are each preferably constituted with a CCD or CMOS circuit. In view of noise properties and high speed performance, the readout circuit 40 is preferably constituted with a CMOS circuit.

Though not shown in the drawing, for example, an n-region of a high concentration that is surrounded by a p-region is formed in the substrate 12. The n-region is connected to the first connection portions 44, and the readout circuits 40 are disposed in the p-region. The n-region functions as an electric charge accumulating portion that accumulates the electric charges of the photoelectric conversion layer 50. Signal electric charges accumulated in the n-region are converted into signals by the readout circuits 40 according to the electric charge amount, and output to the outside of the imaging device 10 through, for example, the wiring layer 48.

The buffer layer 21 has the same configuration as the above-described buffer layer 109, and is a layer for ensuring heat resistance and inhibiting the deterioration of heat resistance of photoelectric conversion characteristics of the organic layer 18.

The buffer layer 21 includes hydrogenated silicon oxide (SiOx:H) containing hydrogen ions but no element nitrogen (N) and has a thickness of 1 to 100 nm.

The buffer layer 21 is formed by, for instance, a vapor deposition method, and preferably by a plasma-enhanced CVD method.

When a hydrogenated silicon oxide film (SiOx:H film) is formed as the buffer layer 21 by a plasma-enhanced CVD method at not more than 200° C. using $SiH_4$ gas and $N_2O$ gas, this hydrogenated silicon oxide film is to contain hydrogen ions. Accordingly, as the buffer layer 21, the hydrogenated silicon oxide (SiOx:H) film containing hydrogen ions is used. The buffer layer 21 is also transparent with respect to incident light L (e.g., visible light).

The protective film 22 has the same configuration as the above-described protective film 110. The protective film 22 is for protecting the organic layer 18 including the photoelectric conversion layer 50 from factors such as water molecules and oxygen causing deterioration, and for preventing the organic layer 18 from deteriorating after long term storage and long term use. The protective film 22 is formed on the buffer layer 21.

The protective film 22 is composed of hydrogenated silicon oxynitride (SiOxNy:H) containing hydrogen ions and silicon oxynitride, and has a film thickness of 30 to 500 nm.

As the protective film 22, an element nitrogen (N)-rich hydrogenated silicon oxynitride (SiOxNy:H, $0.5<x$, $0.6<y$) film containing hydrogen ions is preferable for use. This element nitrogen (N)-rich hydrogenated silicon oxynitride (SiOxNy:H) film containing hydrogen ions has excellent barrier properties and serves to prevent heat resistance of the organic layer 18 from deteriorating.

The protective film 22 is formed by, for instance, a vapor deposition method, and preferably by a plasma-enhanced CVD method at 220° C. or less. When the protective film 22 is formed by a vapor deposition method, this leads to lower internal stress. For instance, it is possible to make the internal stress of the protective film 22 be 100 MPa or less in absolute value, i.e., make each of its tensile stress and compressive stress be 100 MPa or less. The protective film 22 is also transparent with respect to incident light L (e.g., visible light).

The stress of the protective film 22 and the measurement method thereof are the same as those described for the protective film 110 above and therefore will be not described.

For example, in the imaging device 10 in which the pixel size is less than 2 µm, particularly about 1 µm, when the distance between the color filter 26 and the photoelectric conversion layer 50, i.e., the film thickness of the protective film 22 is large, incident light L (e.g., visible light) may be diffracted or diffused in the protective film 22, resulting in color mixing. Therefore, the protective film 22 is preferably thin in any case.

The color filters 26 are formed in the positions where the color filters 26 are respectively opposed to the pixel electrodes 16 on the protective film 22. The partition 28 is disposed between the color filters 26 on the protective film 22, and is for improving light transmission efficiency of the color filters 26. The light shielding layer 29 is formed on the protective film 22 exclusive of the area where the color filters 26 and the partitions 28 are provided (valid pixel area), and is a layer for preventing light from entering the photoelectric conversion layer 50 formed in the area other than the valid pixel area. The color filters 26, the partitions 28 and the light shielding layer 29 are formed by, for example, a photolithography method, i.e., appropriate baking treatment of resin, or the like.

The overcoat layer 30 is for protecting the color filters 26 during the subsequent steps and the like, and is formed to cover the color filters 26, the partitions 28, and the light shielding layer 29.

In the imaging device 10, one pixel electrode 16 on which the organic layer 18, the counter electrode 20, and the color filter 26 are formed is a unit pixel.

For the overcoat layer 30, polymer materials such as acrylic resins, polysiloxane-based resins, polystyrene-based resins, and fluororesins; and inorganic materials such as silicon oxide and silicon nitride can be used appropriately. It is preferable to use a photosensitive resin such as a polystyrene-based resin because the overcoat layer 30 can be patterned by a photolithography method and hence it is easy to use the photosensitive resin as a photoresist upon formation of openings in the peripheral shielding layer, the sealing layer, the insulating layer and the like on bonding pads and to process the overcoat layer 30 itself into a microlens. Meanwhile, the overcoat layer 30 can be used as an antireflection layer, and it is preferable to form various low-refractive index materials used as the partitions 28 for the color filters 26 into a film. Moreover, in order to seek the function of the protective layer during the subsequent steps performed later and the function of the antireflection layer, the overcoat layer 30 can be constituted with two or more layers composed of a combination of the above materials.

In the present embodiment, the pixel electrodes 16 are formed on the surface of the insulating layer 14. However, the present invention is not limited thereto, and the pixel electrodes 16 may be buried in the surface portion of the insulating layer 14. In addition, the imaging device has a single second connection portion 46 and a single counter electrode voltage supply unit 42, but the imaging device may have a plurality of these portions. For example, when voltage is supplied to the counter electrode 20 from both ends of the counter electrode 20, it is possible to suppress a voltage drop of the counter electrode 20. The number of sets of the second connection portion 46 and the counter electrode voltage supply unit 42 may be appropriately increased or decreased in consideration of a chip area of the device.

Next, the method for producing the imaging device 10 according to the embodiment of the present invention will be described.

Figure 5A:
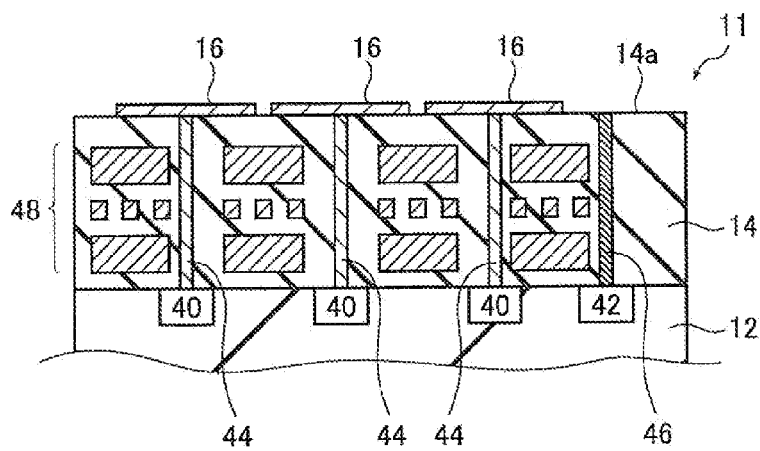
FIGS. 5A to 5C are schematic cross-sectional views showing a method for producing the imaging device according to an embodiment of the present invention in order of sequence.

In the method for producing the imaging device 10 according to the embodiment of the present invention, first, as shown in FIG. 5A, the insulating layer 14 in which the first connection portions 44, the second connection portion 46, and the wiring layer 48 have been formed is formed on the substrate 12 in which the readout circuits 40 and the counter electrode voltage supply unit 42 have been formed, and further, the pixel electrodes 16 connected to the respective first connection portions 44 are formed on the surface 14a of the insulating layer 14, thereby preparing the circuit board 11 (CMOS board). In this case, as described above, the first connection portions 44 are connected to the readout circuits 40, and the second connection portion 46 is connected to the counter electrode voltage supply unit 42. The pixel electrodes 16 are formed of, for example, TiN.

Figure 5B:
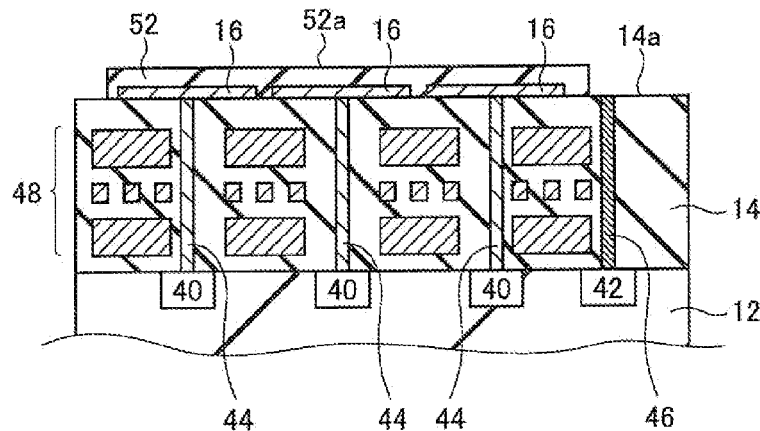

Subsequently, the circuit board 11 is transported along a predetermined transport path to a film formation chamber (not shown in the drawing) for forming the electron blocking layer 52. As shown in FIG. 5B, an electron blocking material is formed into a film by, for example, a deposition method in a vacuum of a predetermined degree such that the film covers all the pixel electrodes 16 except the portion on the second connection portion 46, whereby the electron blocking layer 52 is formed. As the electron blocking material, for example, carbazole derivatives and more preferably bifluorene derivatives are usable.

Figure 5C:
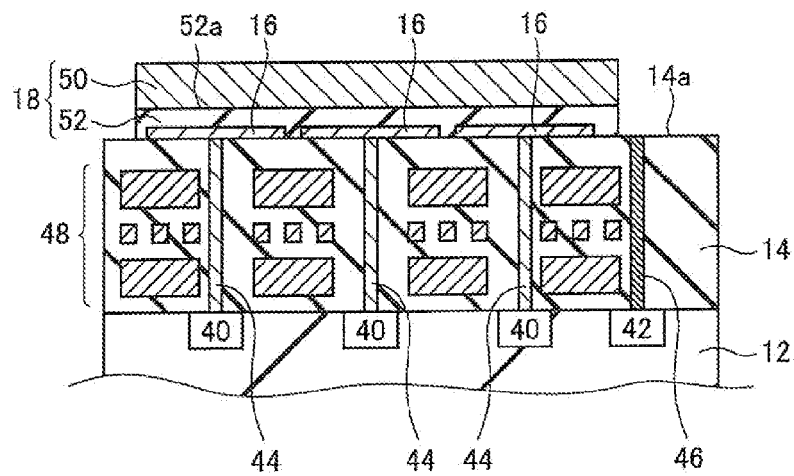

The resultant is then transported along a predetermined transport path to a film formation chamber (not shown in the drawing) for forming the photoelectric conversion layer 50. As shown in FIG. 5C, on a surface 52a of the electron blocking layer 52, the photoelectric conversion layer 50 is formed by, for example, a deposition method in a vacuum of a predetermined degree. As the photoelectric conversion material, for example, a p-type organic semiconductor material and a fullerene or a fullerene derivative are used. In this manner, the photoelectric conversion layer 50 is formed to form the organic layer 18.

Figure 6A:
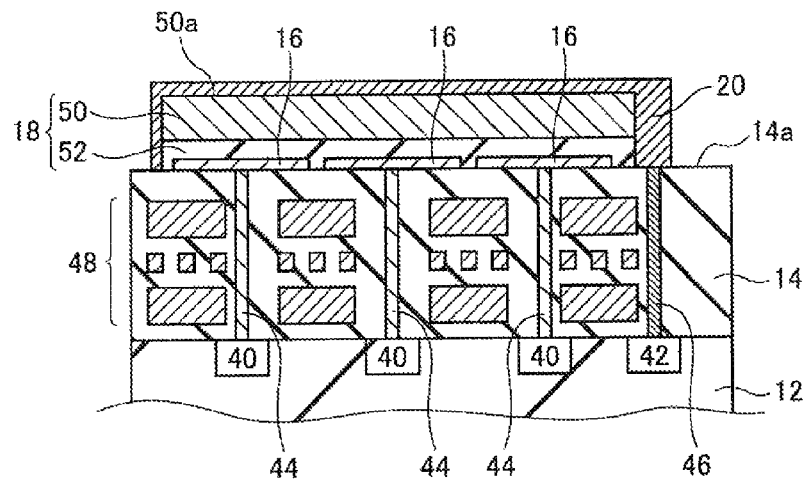
FIGS. 6A to 6C are schematic cross-sectional views showing the method for producing the imaging device according to an embodiment of the present invention in order of steps, after the step shown in FIG. 5C.

Thereafter, the resultant is transported along a predetermined transport path to a film formation chamber (not shown in the drawing) for forming the counter electrode 20. Subsequently, as shown in FIG. 6A, as the pattern to cover the organic layer 18 and to be provided on the second connection portion 46, the counter electrode 20 is formed by, for example, a sputtering method in a vacuum of a predetermined degree.

Figure 6B:
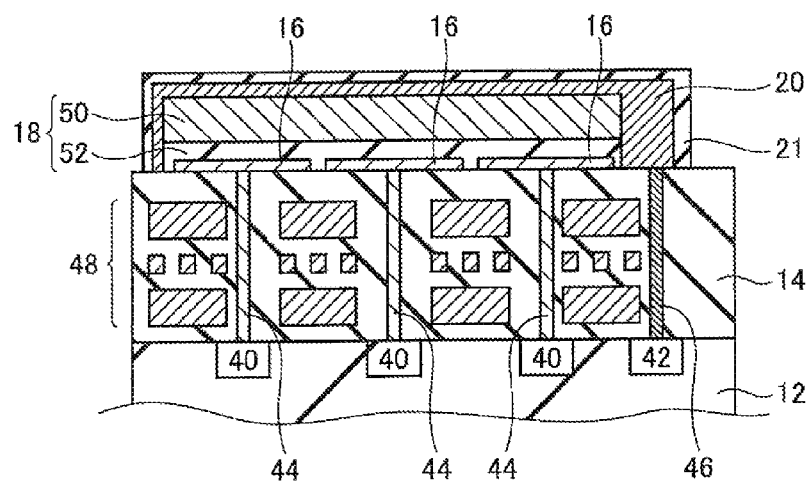

The resultant is then transported along a predetermined transport path to a film formation chamber (not shown in the drawing) for forming the buffer layer 21. As shown in FIG. 6B, as the buffer layer 21, a hydrogenated silicon oxide film (SiOx:H film; for instance, x=1.9 and the hydrogen ion content being 30 atm %) is formed to a thickness of 10 nm on the surface 14a of the insulating layer 14 by, for example, a plasma-enhanced CVD method so as to cover the counter electrode 20.

The buffer layer 21 is formed by a plasma-enhanced CVD method using process gases, for example, $SiH_4$ gas and $N_2O$ gas. Accordingly, the hydrogenated silicon oxide (SiOx:H) film containing hydrogen ions is used as the buffer layer 21, and the element nitrogen is not contained therein. The film formation temperature for the buffer layer 21 is preferably 125° C. to 250° C.

Figure 6C:
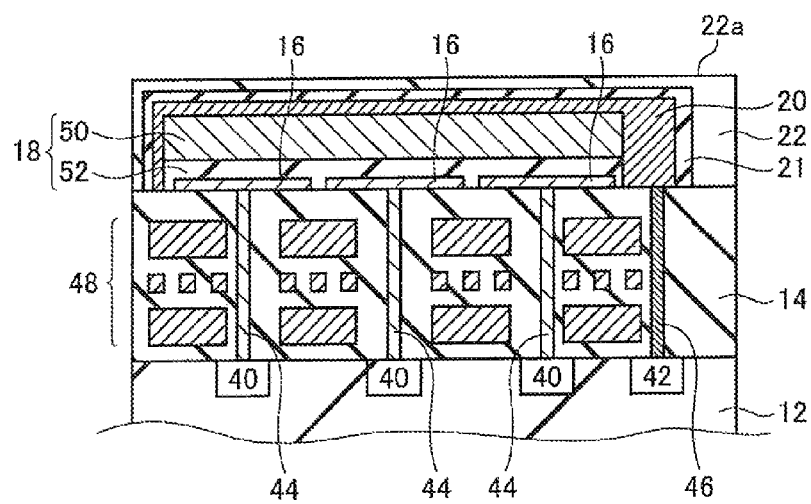

Subsequently, for instance, in the same film formation chamber (not shown in the drawing) as used for the formation of the buffer layer 21, as shown in FIG. 6C, as the protective film 22, a hydrogenated silicon oxynitride film (SiOxNy:H film; for instance, the hydrogen ion content is 30 atm %) is formed to a thickness of 300 nm on the buffer layer 21 by, for example, a plasma-enhanced CVD method using the process gases of $SiH_4$ gas, $NH_3$ gas and $N_2O$ gas.

In this case, even when $NH_3$ gas is used, the buffer layer 21 inhibits the contact between the organic layer 18 and the $NH_3$ gas as well as radicals and ions generated from the $NH_3$ gas. Accordingly, adverse effects caused during the formation of the protective film 22, more specifically, the deterioration of heat resistance of the organic layer 18 is suppressed.

The protective film 22, e.g., the hydrogenated silicon oxynitride film (SiOxNy:H film) preferably has an internal stress of 100 MPa or less in absolute value. As to the internal stress of the protective film 22, it is preferable to examine, for example, the relation among the film composition, the internal stress, and the film formation conditions in advance and then to form the protective film 22 to a thickness of 30 to 500 nm under the film formation conditions with which the internal stress can fall within the above range. The film formation temperature of the protective film 22 is preferably 150° C. to 250° C.

Next, on a surface 22a of the protective film 22, the color filters 26, the partitions 28, and the light shielding layer 29 are formed by, for example, a photolithography method. For the color filters 26, the partitions 28, and the light shielding layer 29, known materials used for organic solid-state imaging devices are used. The processes for forming the color filters 26, the partitions 28, and the light shielding layer 29 may be performed in a vacuum of a predetermined degree or performed in a non-vacuum environment. The processes for forming the color filters 26, the partitions 28, and the light shielding layer 29 include baking treatment of resin and the like.

Then the overcoat layer 30 is formed by, for example, a coating method so as to cover the color filters 26, the partitions 28, and the light shielding layer 29. In this manner, the imaging device 10 shown in FIG. 4 can be formed. For the overcoat layer 30, known materials used for organic solid-state imaging devices are used. The process for forming the overcoat layer 30 may be performed in a vacuum of a predetermined degree or performed in a non-vacuum environment.

In the present embodiment, the buffer layer 21 including hydrogenated silicon oxide (SiOx:H) containing hydrogen ions but no element nitrogen (N) is provided on the counter electrode 20; and the element nitrogen-containing hydrogenated silicon oxynitride film (SiOxNy:H film), more preferably hydrogenated silicon oxynitride film (SiOxNy:H film; x>0.5, y>0.6) having high barrier properties is provided on the buffer layer 21. Owing to this configuration, it is possible to ensure heat resistance by means of the buffer layer 21 and to ensure barrier properties by means of the protective film 22, whereby the imaging device 10 excellent in both barrier properties and heat resistance can be obtained.

In addition, even when $NH_3$ gas is used as a process gas at the time of the formation of the hydrogenated silicon oxynitride film (SiOxNy:H film) as the protective film 22, the buffer layer 21 (SiOx:H film) serves to inhibit the deterioration of heat resistance of the organic layer 18. Furthermore, since the buffer layer 21 (SiOx:H film) has excellent heat resistance, even in the case where, for instance, the process for forming the color filters 26 include baking treatment, the deterioration of photoelectric conversion characteristics of the organic layer 18 can be suppressed. As a result, the imaging device 10 excellent in both barrier properties and heat resistance can be produced.

Furthermore, the buffer layer 21 and the protective film 22 can be formed in the same film formation chamber by using different process gases, and it is therefore possible to simplify the production facility and reduce the production costs. Furthermore, since the plasma-enhanced CVD method is used, the deposition rate is higher as compared to other film formation methods, and therefore the productivity can be enhanced.

Next, the photoelectric conversion layer 50 (refer to the photoelectric conversion layer 112) and the electron blocking layer 52 (refer to the electron blocking layer 114) constituting the organic layer 18 (refer to the organic layer 106) will be described in more detail.

The photoelectric conversion layer 50 is constituted in the same manner as the aforementioned photoelectric conversion layer 112. The photoelectric conversion layer 50 contains a p-type organic semiconductor material and an n-type organic semiconductor material. By joining the p-type organic semiconductor material with the n-type organic semiconductor material to form a donor-acceptor interface, exciton dissociation efficiency can be increased. Therefore, the photoelectric conversion layer having a constitution in which the p-type organic semiconductor material is joined with the n-type organic semiconductor material realizes high photoelectric conversion efficiency. In particular, the photoelectric conversion layer in which the p-type organic semiconductor material is mixed with the n-type organic semiconductor material is preferable since the junction interface is enlarged, and the photoelectric conversion efficiency is improved.

The p-type organic semiconductor material (compound) is a donor-type organic semiconductor material (compound). This material is mainly typified by a hole-transporting organic compound and refers to an organic compound that is likely to donate electrons. More specifically, when two organic materials are used by bringing them into contact with each other, an organic compound having a smaller ionization potential is called the p-type organic semiconductor material. Accordingly, as the donor-type organic compound, any organic compounds can be used as long as they have electron-donating properties. For example, it is possible to use a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, condensed aromatic carbon ring compounds (naphthalene derivatives, anthracene derivatives, phenanthrene derivatives, tetracene derivatives, pyrene derivatives, perylene derivatives, and fluoranthene derivatives), metal complexes having nitrogen-containing heterocyclic compounds as ligands, and the like. The donor-type organic compound is not limited to these, and as described above, any of organic compounds having a smaller ionization potential compared to organic compounds used as n-type (acceptor-type) compounds may be used as the donor-type organic semiconductor.

The n-type organic semiconductor material (compound) is an acceptor-type organic semiconductor material. This material is mainly represented by an electron-transporting organic compound and refers to an organic compound that easily accepts electrons. More specifically, when two organic compounds are used by being brought into contact to each other, an organic compound showing a higher degree of electron affinity is called the n-type organic semiconductor material. Accordingly, as the acceptor-type organic compound, any organic compounds can be used as long as they have electron-accepting properties. For example, it is possible to use condensed aromatic carbon ring compounds (naphthalene derivatives, anthracene derivatives, phenanthrene derivatives, tetracene derivatives, pyrene derivatives, perylene derivatives, and fluoranthene derivatives), 5 to 7-membered heterocyclic compounds containing nitrogen atoms, oxygen atoms, or sulphur atoms (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), a polyarylene compound, a fluorene compound, a cyclopentadiene compound, a silyl compound, metal complexes having nitrogen-containing heterocyclic compounds as ligands, and the like. The acceptor-type organic compound is not limited to these, and as described above, any of organic compounds showing a higher degree of electron affinity compared to organic compounds used as p-type (donor-type) compounds may be used as the acceptor-type organic compound.

As the p-type organic semiconductor material or the n-type organic semiconductor material, any organic dye may be used. However, preferable examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthalperylene dyes, diketopyrrolopyrrole dyes, dioxane dyes, porphyrin dyes, chlorophyll dyes, phthalocyanine dyes, metal complex dyes, and condensed aromatic carbon ring-based dyes (naphthalene derivatives, anthracene derivatives, phenanthrene derivatives, tetracene derivatives, pyrene derivatives, perylene derivatives, and fluoranthene derivatives).

As the n-type organic semiconductor material, it is particularly preferable to use a fullerene or a fullerene derivative having excellent electron transport properties. Fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene, or fullerene nanotubes, and fullerene derivatives refer to compounds obtained when a substituent is added to the fullerene.

As the substituent of the fullerene derivatives, alkyl groups, aryl groups, or heterocyclic groups are preferable. As the alkyl groups, alkyl groups having 1 to 12 carbon atoms are more preferable. As the aryl and heterocyclic groups, benzene rings, naphthalene rings, anthracene rings, phenanthrene rings, fluorene rings, triphenylene rings, naphthacene rings, biphenyl rings, pyrrole rings, furan rings, thiophene rings, imidazole rings, oxazole rings, thiazole rings, pyridine rings, pyrazine rings, pyrimidine rings, pyridazine rings, indolizine rings, indole rings, benzofuran rings, benzothiophene rings, isobenzofuran rings, benzimidazole rings, imidazopyridine rings, quinolizine rings, quinoline rings, phthalazine rings, naphthyridine rings, quinoxaline rings, quinoxazoline rings, isoquinoline rings, carbazole rings, phenanthridine rings, acridine rings, phenanthroline rings, thianthrene rings, chromene rings, xanthene rings, phenoxathiin rings, phenothiazine rings, or phenazine rings are preferable, benzene rings, naphthalene rings, anthracene rings, phenanthrene rings, pyridine rings, imidazole rings, oxazole rings, or thiazole rings are more preferable, and benzene rings, naphthalene rings, or pyridine rings are particularly preferable. These may further contain a substituent, and the substituent may bind to form a ring as much as possible. Moreover, the above substituents may have plural substituents which may be identical to or different from each other. The plural substituents may bind to form a ring as much as possible.

When the photoelectric conversion layer contains a fullerene or a fullerene derivative, electrons generated by photoelectric conversion can be rapidly transported to the pixel electrodes 16 or the counter electrode 20 via fullerene molecules or fullerene derivative molecules. When the fullerene molecules or fullerene derivative molecules line up and form the pathway of electrons in this state, electron transport properties are improved, whereby high-speed responsiveness of the photoelectric conversion element can be realized. In order to achieve the above improvement, it is preferable for the photoelectric conversion layer to contain a fullerene or a fullerene derivative in a proportion (volume ratio) of 40% or more. However, when the proportion of a fullerene or a fullerene derivative is too high, the proportion of the p-type organic semiconductor is reduced, and the junction interface becomes small, whereby the exciton dissociation efficiency is reduced.

For the photoelectric conversion layer 50, it is particularly preferable to use triarylamine compounds, which are disclosed in JP 4213832 B and the like, as the p-type organic semiconductor material mixed with a fullerene or a fullerene derivative, since a high SN ratio of the photoelectric conversion element can be realized. When the proportion of a fullerene or a fullerene derivative in the photoelectric conversion layer is too high, the proportion of the triarylamine compounds is reduced, and the amount of absorbed incident light decreases. Since the photoelectric conversion efficiency is reduced for this reason, it is preferable for the proportion (volume ratio) of a fullerene or a fullerene derivative contained in the photoelectric conversion layer to be 85% or less.

The electron blocking layer 52 is constituted in the same manner as the aforementioned electron blocking layer 114. Electron-donating organic materials can be used for the electron blocking layer 52. Specifically, as low-molecular weight materials, it is possible to use aromatic diamine compounds such as N,N'-bis(3-methylphenyl)-(1,1'-biphenyl)-4,4'-diamine (TPD) or 4,4'-bis[N-(naphthyl)-N-phenylamino]biphenyl (α-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MT-DATA), porphyrin compounds such as porphine, tetraphenylporphyrin copper, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, silazane derivatives, carbazole derivatives, bifluorene derivatives, and the like. As high-molecular weight materials, it is possible to use polymers such as phenylene vinylene, fluorene, carbazole, indole, pyrene, pyrrole, picoline, thiophene, acetylene, and diacetylene and derivatives of these. The compounds that are not electron-donating compounds can also be used as long as they have sufficient hole transport properties.

As the electron blocking layer 52, inorganic materials can also be used. Generally, inorganic materials have a higher dielectric constant compared to organic materials. Accordingly, when inorganic materials are used for the electron blocking layer 52, higher voltage is applied to the photoelectric conversion layer, hence the photoelectric conversion efficiency can be improved. Examples of materials that can form the electron blocking layer 52 include calcium oxide, chromium oxide, copper-chromium oxide, manganese oxide, cobalt oxide, nickel oxide, copper oxide, copper-gallium oxide, copper-strontium oxide, niobium oxide, molybdenum oxide, copper-indium oxide, silver-indium oxide, and iridium oxide.

In the electron blocking layer consisting of plural layers, it is preferable that among the plural layers, the layer adjacent to the photoelectric conversion layer 50 be a layer which is made of the same material as the p-type organic semiconductor contained in the photoelectric conversion layer 50. When the p-type organic semiconductor in the photoelectric conversion layer 50 is also used for the electron blocking layer 52 in this manner, it is possible to inhibit an intermediate energy level from being formed in the interface between the photoelectric conversion layer 50 and the layer adjacent thereto, and to further suppress dark currents.

When the electron blocking layer 52 consists of a single layer, the layer can be formed of an inorganic material. When the electron blocking layer 52 consists of plural layers, one or more layers can be formed of an inorganic material.

The present invention is basically configured as above. So far, the photoelectric conversion element and the imaging device of the present invention have been described in detail. However, the present invention is not limited to the above embodiments. Needless to say, the present invention may be improved or modified in various ways, within a range that does not depart from the gist of the present invention.

EXAMPLES

Hereinafter, the effects of the present invention will be described in detail.

In the present Examples, a main body of the photoelectric conversion element having the substrate 102, the lower electrode 104, the organic layer 106 including the electron blocking layer 114 and the photoelectric conversion layer 112, and the upper electrode 108 as shown in FIG. 1 was prepared. The substrate 102 is constituted with a non-alkali glass substrate having a thickness of 0.7 nm; the lower electrode 104 was formed of ITO having a thickness of 100 nm; the organic layer 106 was configured as described below; and the upper electrode 108 was formed of ITO having a thickness of 10 nm.

The blocking layer 114 of the organic layer 106 was formed as follows. The above substrate 102 was transported to an organic deposition chamber, the organic deposition chamber was sealed, and the pressure in the interior of this chamber was reduced to $1 \times 10^{-4}$ Pa. Then, a compound expressed by Chemical Formula 1 below was formed into a film having a thickness of 100 nm on the pixel electrode by vacuum deposition at a deposition rate of 0.1 to 0.12 nm/sec.

(CHEMICAL FORMULA 1)

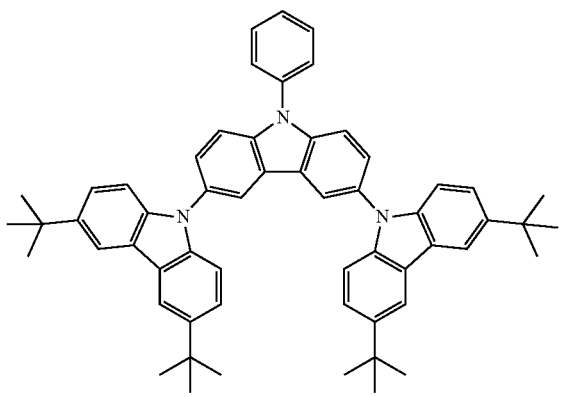

As for the photoelectric conversion layer 112 of the organic layer 106, a compound expressed by Chemical Formula 2 below (fullerene $C_{60}$) and a compound expressed by Chemical Formula 3 below were co-deposited at deposition rates of 16 to 18 nm/s and 25 to 28 nm/s, respectively, such that the volume ratio of the compound of Chemical Formula 2 to the compound of Chemical Formula 3 became 1:3, thereby forming the photoelectric conversion layer 112 having a thickness of 400 nm.

(CHEMICAL FORMULA 2)

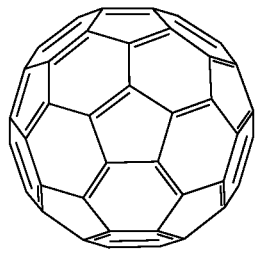

(CHEMICAL FORMULA 3)

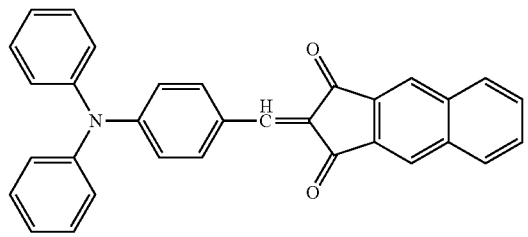

The prepared photoelectric conversion element main body was transported along a predetermined transport path to a film formation chamber (not shown in the drawing) of a plasma CVD system (CIH-130 manufactured by ULVAC, Inc.), the substrate temperature was adjusted to 180° C., and the buffer layer 109 composed of a hydrogenated silicon oxide film (SiOx:H; x=1.9; hydrogen ion content, 30 atm %) having a thickness of 10 nm was formed by a plasma-enhanced CVD method using $SiH_4$ gas and $N_2O$ gas as film formation process gases on the substrate 102 of the photoelectric conversion element main body so as to entirely cover the photoelectric conversion element main body from the top of the upper electrode 108. At that time, the gas flow rate, the gas pressure, and the RF power were adjusted such that the refractive index n of the hydrogenated silicon oxide film formed as the buffer layer 109 became 1.46.

The photoelectric conversion element main body with the buffer layer 109 thus formed was transported along a predetermined transport path to the same film formation chamber (not shown in the drawing) of the plasma CVD system as used for the formation of the buffer layer 109, the substrate temperature was adjusted to 180° C., and the protective film 110 composed of a hydrogenated silicon nitride film (SiNy:H; y=1.3; hydrogen ion content: 30 atm %) having a thickness of 300 nm was formed by a plasma-enhanced CVD method using $SiH_4$ gas, $NH_3$ gas and $N_2O$ gas as process gases on the substrate 102 of the photoelectric conversion element main body so as to entirely cover the photoelectric conversion element main body from the top of the buffer layer 109. At that time, the gas flow rate, the gas pressure, and the RF power were adjusted such that the refractive index n of the hydrogenated silicon nitride film formed as the protective film 110 became 1.65.

Thus, a sample of the photoelectric conversion element of Example 1 of the invention was prepared.

Next, a sample of the photoelectric conversion element of Example 2 of the invention was prepared in the same manner as in Example 1, except that the protective film 110 was changed in the composition to use a hydrogenated silicon oxynitride film (SiOxNy:H; x=0.7, y=0.64; hydrogen ion content: 30 atm %).

Furthermore, samples of photoelectric conversion elements of Comparative Examples 1 and 2 were prepared substantially in the same manner as in Examples 1 and 2 of the invention, except that no buffer layer 109 was provided and accordingly, the protective film 110 was formed to entirely cover the photoelectric conversion element main body from the top of the upper electrode 108. In the sample of the photoelectric conversion element of Comparative Example 1, the protective film 110 constituted by a hydrogenated silicon nitride film (SiNy:H; y=1.2; hydrogen ion content: 30 atm %) which was slightly different in the composition from the hydrogenated silicon nitride film of Example 1 of the invention was formed. In the sample of the photoelectric conversion element of Comparative Example 2, the protective film 110 composed of a hydrogenated silicon oxynitride film having the same composition as that used in Example 2 of the invention was formed.

The thus-prepared samples of Examples 1 and 2 and Comparative Examples 1 and 2 were evaluated in terms of heat resistance and barrier properties. The evaluation results are shown in Table 1 below.

The results of heat resistance evaluation shown in Table 1 below were obtained by using the following evaluation method and evaluation criteria.

In the evaluation method of heat resistance, before heating, the sensitivities of the respective samples of Examples 1 and 2 and Comparative Examples 1 and 2 were measured under an applied electric field of 10 V/μm, thereby obtaining the sensitivities of the samples before heating.

Subsequently, the samples of Examples 1 and 2 and Comparative Examples 1 and 2 were allowed to stand on a hot plate at a temperature of 210° C. for 30 minutes under atmospheric pressure, whereafter, the sensitivities of the samples were measured under an applied electric field of 10 V/μm, thereby obtaining the sensitivities of the samples after heating. Then, the sensitivities before and after heating were compared to each other for each of the samples of Examples 1 and 2 and Comparative Examples 1 and 2, whereby heat resistance was evaluated.

The evaluation criteria of heat resistance were as follows. The relative decrease in the sensitivity measured under an applied electric field of 10 V/μm being less than 1% was evaluated as Excellent; the relative decrease being less than 3% as Good; the relative decrease being less than 5% as Fair; the relative decrease being less than 10% as Poor; and the relative decrease being less than 20% as Very Poor.

The results of barrier property evaluation shown in Table 1 below were obtained by using the following evaluation method and evaluation criteria.

In the evaluation method of barrier properties, before the exposure to a humid atmosphere to be described later, the sensitivities of the respective samples of Examples 1 and 2 and Comparative Examples 1 and 2 were measured under an applied electric field of 10 V/μm, thereby obtaining the sensitivities of the samples before the exposure to the humid atmosphere. Next, the samples of Examples 1 and 2 and Comparative Examples 1 and 2 were allowed to stand in an environment having a temperature of 60° C. and a relative humidity of 90% for 100 hours. Subsequently, the sensitivities of the respective samples of Examples 1 and 2 and Comparative Examples 1 and 2 were measured under an applied electric field of 10 V/μm, thereby obtaining the sensitivities of the samples after the exposure to the humid atmosphere. Then, the sensitivities before and after the exposure to the humid atmosphere were compared to each other for each of the samples of Examples 1 and 2 and Comparative Examples 1 and 2, whereby barrier properties were evaluated.

The evaluation criteria of barrier properties is as follows. The relative decrease in the sensitivity measured under an applied electric field of 10 V/μm being less than 1% is evaluated as Excellent; the relative decrease being less than 3% as Good; the relative decrease being less than 5% as Fair; the relative decrease being less than 10% as Poor; and the relative decrease being less than 20% as Very Poor.

TABLE 1

| | Configuration | | Evaluation item | |
| --- | --- | --- | --- | --- |
| | Buffer layer (SiOx: H) | Protective film (SiOxNy: H) | Heat resistance (Sensitivity after heating at 210° C. for 30 mins.) | Barrier properties (Sensitivity after exposure to a temperature of 60° C. and a relative humidity of 90% for 100 hours) |
| EX1 | x = 1.9, H: 30 atm %, 10 nm | x = 0, y = 1.3, H: 30 atm %, 300 nm | Fair | Excellent |

TABLE 1-continued

|   | Configuration | | Evaluation item | |
|---|---|---|---|---|
|   | Buffer layer (SiOx: H) | Protective film (SiOxNy: H) | Heat resistance (Sensitivity after heating at 210° C. for 30 mins.) | Barrier properties (Sensitivity after exposure to a temperature of 60° C. and a relative humidity of 90% for 100 hours) |
| EX2 | x = 1.9, H: 30 atm %, 10 nm | x = 0.7, y = 0.64, H: 30 atm %, 300 nm | Good | Good |
| CE1 | None | x = 0, y = 1.2, H: 30 atm %, 300 nm | Very poor | Excellent |
| CE2 | None | x = 0.7, y = 0.64, H: 30 atm %, 300 nm | Fair | Poor |

As can be seen from Table 1, heat resistance and barrier properties are both achieved in Examples 1 and 2.

In contrast, Comparative Examples 1 and 2 fail to achieve both heat resistance and barrier properties.

The photoelectric conversion element according to the present invention is applicable to, for example, an imaging device (image sensor) such as various types of imaging apparatuses and imaging modules, an optical sensor, an organic electroluminescence film element (organic EL element) and an organic solar cell.

Furthermore, the imaging device according to the present invention can be mounted for use on an imaging apparatus such as a digital camera, a digital video camera and a surveillance camera, an imaging module such as an electronic endoscope and a mobile phone, and the like.

What is claimed is:

1. A photoelectric conversion element comprising:
   a substrate;
   a lower electrode formed on the substrate;
   an organic layer formed on the lower electrode and adapted to generate electric charges in response to irradiation with light;
   an upper electrode formed on the organic layer and adapted to transmit the light;
   a buffer layer formed on the upper electrode; and
   a protective film formed on the buffer layer,
   wherein the buffer layer is composed of hydrogenated silicon oxide having a hydrogen ion content of 10 atm % to 40 atm % and has a thickness of 1 nm to 100 nm; and
   wherein the protective film is composed of hydrogenated silicon nitride containing hydrogen ions or hydrogenated silicon oxynitride containing hydrogen ions and has a thickness of 30 nm to 500 nm.

2. The photoelectric conversion element according to claim 1, wherein the buffer layer contains no element nitrogen.

3. The photoelectric conversion element according to claim 1, wherein the protective film has an internal stress of 100 MPa or less as expressed in absolute value.

4. The photoelectric conversion element according to claim 1, wherein the buffer layer and the protective film are formed by a vapor phase film formation method.

5. The photoelectric conversion element according to claim 1, wherein the upper electrode has a thickness of 5 nm to 30 nm.

6. The photoelectric conversion element according to claim 1, wherein the hydrogenated silicon oxynitride is expressed by a formula: SiOxNy:H [where x>0.5 and y>0.6], and has a hydrogen ion content of 10 atm % to 40 atm %.

7. The photoelectric conversion element according to claim 1, wherein the light includes at least visible light;
   wherein the organic layer generates electric charges in response to irradiation of the light including at least visible light; and
   wherein the upper electrode is formed of a conductive material showing transparency with respect to the light including at least visible light.

8. The photoelectric conversion element according to claim 1, wherein the organic layer includes a photoelectric conversion layer that is formed on a side closer to the upper electrode and that is adapted to generate electric charges according to an amount of received light, and an electron blocking layer that is formed at a side closer to the lower electrode and that is adapted to inhibit electrons from being injected into the photoelectric conversion layer from the lower electrode.

9. The photoelectric conversion element according to claim 8, wherein the photoelectric conversion layer has a thickness of 10 nm to 1000 nm.

10. The photoelectric conversion element according to claim 8, wherein the electron blocking layer has a thickness of 20 nm to 300 nm.

11. An imaging device comprising the photoelectric conversion element according to claim 1.

12. The photoelectric conversion element according to claim 1, wherein the hydrogenated silicon oxynitride is expressed by a formula: SiOx:H [where 1.3 <x <2.2].

13. The photoelectric conversion element according to claim 1, wherein the buffer layer prevents an influence exerted by $NH_3$ gas and by radicals and ions generated from the $NH_3$ gas.

14. The photoelectric conversion element according to claim 1, wherein the buffer layer has a refractive index of 1.50 or less at 550 nm.

15. The photoelectric conversion element according to claim 1,
   wherein the buffer layer is formed by a plasma-enhanced CVD method, $NH_3$ gas is used as a process gas, a film formation temperature of the buffer layer is 125° C. to 250° C., and
   wherein the protective film is formed by a plasma-enhanced CVD method, at least two of $SiH_4$ gas, $NH_3$ gas and $N_2O$ gas are used as a process gas, a film formation temperature of the buffer layer is 125° C. to 250° C.

* * * * *